United States Patent
Rashid

(10) Patent No.: US 6,958,634 B2
(45) Date of Patent: Oct. 25, 2005

(54) PROGRAMMABLE DIRECT INTERPOLATING DELAY LOCKED LOOP

(75) Inventor: Mamun Ur Rashid, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/746,105

(22) Filed: Dec. 24, 2003

(65) Prior Publication Data

US 2005/0140416 A1 Jun. 30, 2005

(51) Int. Cl.$^7$ ................................................ H03L 7/00
(52) U.S. Cl. ...................................... 327/141; 327/261
(58) Field of Search ................................ 327/141, 237, 327/246, 261, 276, 277, 291, 294; 375/371

(56) References Cited

U.S. PATENT DOCUMENTS

| 6,329,859 B1 | * | 12/2001 | Wu ............................. 327/291 |
| 6,525,615 B1 | * | 2/2003 | Masenas et al. .............. 331/34 |
| 6,650,157 B2 | * | 11/2003 | Amick et al. ................ 327/158 |
| 2003/0042957 A1 | | 3/2003 | Tamura ....................... 327/233 |

OTHER PUBLICATIONS

PCT International Search Report dated May 6, 2005—related application, International Application No. PCT/US2004/043664—International Filing Date Dec. 22, 2004 (14 pages).

"Programmable Memory Controller", IBM Technical Disclosure Bulletin, IBM Corp., New York, USA, vol. 31, No. 9, Feb. 1, 1989, pp. 351–354, XP000097564, ISSN: 0018–8689.

Patent Abstracts of Japan, vol. 1999, No. 14, Dec. 22, 1999 and JP 11 261408, Inventor: Wakayama Shigetoshi, Applicant: Fujitsu Ltd., entitled "Phase Interpolator, Timing Signal Generating Circuit, and Semiconductor Integrated Circuit Device and Semiconductor Integrated Circuit System Adopting the Timing Signal Generating Circuit".

EP 1 229 646 A2, Date of Publication Aug. 7, 2002, Inventor: Tanahashi, Toshio, Applicant: NEC Corporation, entitled "Two Step Variable Length Delay Circuit".

JP 2000 298532 A (Hitachi Ltd; Hitachi ULSI Systems Co. Ltd.), Oct. 24, 2000.

* cited by examiner

Primary Examiner—Linh My Nguyen
(74) Attorney, Agent, or Firm—Sharon Wong

(57) ABSTRACT

Embodiments of the invention provide for a delay locked loop architecture including a coarse-fine type arrangement using one loop for non-continuous strobe that can be also be configured for continuous clocks as well. In particular, a reference loop establishes precise coarse unit delay. A slave delay line duplicates unit delay. A phase interpolator interpolates between unit delay to produce fine delay.

27 Claims, 7 Drawing Sheets

PROGRAMMABLE DIRECT INTERPOLATING DELAY LOCKED LOOP

BACKGROUND

In a memory subsystem that operates in a source synchronous manner, the device that transmits a data signal on a conductive data line also transmits a strobe signal on a separate conductive line. A pulse in the strobe signal has a predefined phase relationship to each associated pulse in a number of data signals. The pulse in the strobe signal is used to capture bit values in the data signals at the receiving device. In particular, the data and strobe signals are run through receiver circuitry that detects the logic levels that are being asserted, and translates them into voltage levels that are suitable for processing by controller circuitry in an integrated circuit (IC) die. The outputs of the receiver circuitry are then fed to a number of latches each of which captures a bit value in a respective data signal in response to a pulse in the strobe signal.

For example, Double Data Rate (DDR) memory devices use source synchronous transfers when data is read from the memory devices. The data strobe signal (DQS) is sent along with the data (DQ) to be clocked. The clocking edges of the DQS signal are coincidental with the data transition time. To capture the data in a register using the DQS signal, the DQS signal needs to be delayed to satisfy the data set-up time requirement of the register.

Conventional memory interfaces use a delay locked loop (DLL) for clock recovery. One configuration is based upon self-biasing techniques in which all bias voltages and currents are referenced to other generated bias voltages and currents. Another configuration is based upon a dual loop DLL architecture for continuously running clock. One loop generates eight equally spaced reference clocks, and the other loop multiplexes between selected successive reference clocks to generate the desired recovered clock. More precision is desired however to place the strobe in the middle of the data eye to maximize system timing margin.

DETAILED DESCRIPTION

Figure 1:
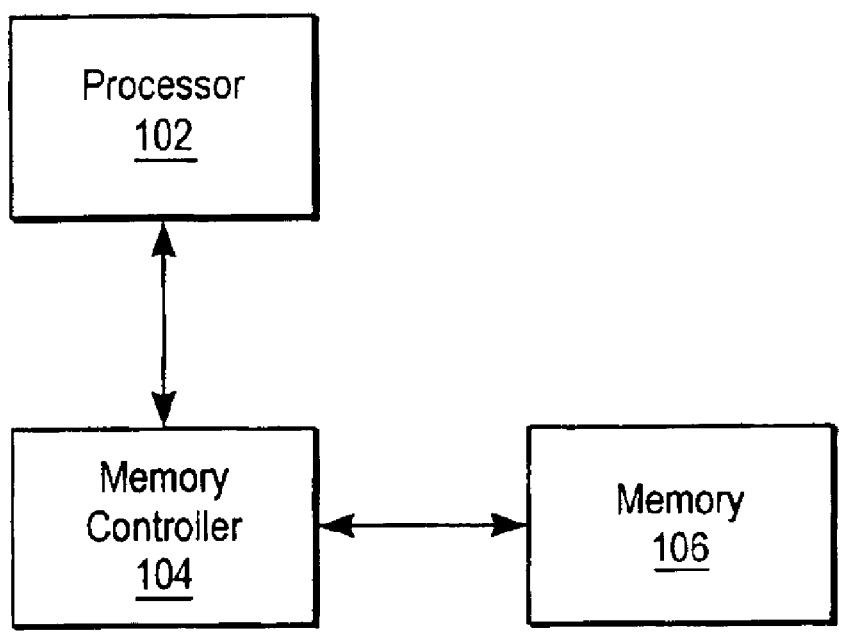
FIG. 1 is a diagram illustrating a system in which one embodiment of the invention can be practiced.

Embodiments of the invention provide for a DLL architecture including a coarse-fine type arrangement using one loop for non-continuous strobe that can be also be adapted for continuous clocks as well. In particular, a reference loop establishes precise coarse unit delay. A slave delay line duplicates unit delay. A phase interpolator (PI) interpolates between unit delay to produce fine delay.

Memory transfers data (DQ) at both rising and falling edges of a bi-directional data strobe (DQS) signal. A programmable delay locked loop (DLL) is used in a memory controller to generate a precise internal strobe delay allowing the incoming strobe to be placed in the middle of the data eye, to maximize system timing. The DLL provides a range of delay with very fine step sizes. In particular, a phase interpolator takes two successive coarse strobe edge angles and interpolates between them to generate finer strobe edges. During boot-up, the memory controller walks through the delay range and selects the optimal delay setting within the passing window.

In the detailed description, numerous specific details are set forth in order to provide a thorough understanding of the present invention. However, it will be understood by those skilled in the art that the present invention may be practiced without these specific details. In other instances, well-known methods, procedures, components and circuits have been described in detail so as not to obscure the present invention.

Some portions of the detailed description that follow are presented in terms of algorithms and symbolic representations of operations on data bits or binary signals within a computer. These algorithmic descriptions and representations are the means used by those skilled in the data processing arts to convey the substance of their work to others skilled in the art. An algorithm is here, and generally, considered to be a self-consistent sequence of steps leading to a desired result. The steps include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities. Unless specifically stated otherwise as apparent from the following discussions, it is appreciated that throughout the specification, discussions utilizing such terms as "processing" or "computing" or "calculating" or "determining" or the like, refer to the action and processes of a computer or computing system, or similar electronic computing device, that manipulate and transform data represented as physical (electronic) quantities within the computing system's registers and/or memories into other data similarly represented as physical quantities within the computing system's memories, registers or other such information storage, transmission or display devices.

Embodiments of the present invention may be implemented in hardware or software, or a combination of both. However, embodiments of the invention may be implemented as computer programs executing on programmable systems comprising at least one processor, a data storage system (including volatile and non-volatile memory and/or storage elements), at least one input device, and at least one output device. Program code may be applied to input data to perform the functions described herein and generate output information. The output information may be applied to one or more output devices, in known fashion. For purposes of this application, a processing system includes any system that has a processor, such as, for example, a digital signal processor (DSP), a micro-controller, an application specific integrated circuit (ASIC), or a microprocessor.

The programs may be implemented in a high level procedural or object oriented programming language to communicate with a processing system. The programs may also be implemented in assembly or machine language, if desired. In fact, the invention is not limited in scope to any particular programming language. In any case, the language may be a compiled or interpreted language.

The programs may be stored on a storage media or device (e.g., hard disk drive, floppy disk drive, read only memory (ROM), CD-ROM device, flash memory device, digital versatile disk (DVD), or other storage device) readable by a general or special purpose programmable processing system, for configuring and operating the processing system when the storage media or device is read by the processing system to perform the procedures described herein. Embodiments of the invention may also be considered to be implemented as a machine-readable storage medium, configured for use with a processing system, where the storage medium so configured causes the processing system to operate in a specific and predefined manner to perform the functions described herein.

For illustrative purposes, embodiments of the present invention are discussed utilizing a bus, memory controller and memory. Embodiments of the present invention are not limited to such a configuration though.

FIG. 1 is a diagram illustrating a system in which one embodiment 100 of the invention can be practiced. Processor 102 represents a processing unit of any type of architecture such as a microcontroller, a digital signal processor, a state machine, or a central processing unit (CPU). The CPU may be implemented with a variety of architecture types such as a complex instruction set computers (CISC), reduced instruction set computers (RISC), very long instruction word (VLIW), or hybrid architecture. Processor 102 interfaces with memory controller 104.

Memory controller 104 provides memory control functions. Memory 106 represents one or more mechanisms for storing information. For example, memory 106 may include non-volatile or volatile memories. Examples of these memories include flash memory, read only memory (ROM), or random access memory (RAM). Memory 106 may contain a program and other programs and data. Of course, memory 106 preferably contains additional software (not shown), which is not necessary for understanding the invention.

In one embodiment of the present invention, memory 106 includes double data rate dynamic random access memories (DDR DRAM). DDR DRAM uses a double data rate architecture to achieve high-speed operation. The double data rate architecture is essentially a 2n-prefetch architecture with an interface designed to transfer two data words per clock cycle at the I/O pins. In a typical DDR DRAM, a bi-directional data strobe (DQS) signal is transmitted externally, along with the data (DQ) signal, for use in data capture at the receiver.

Figure 2:
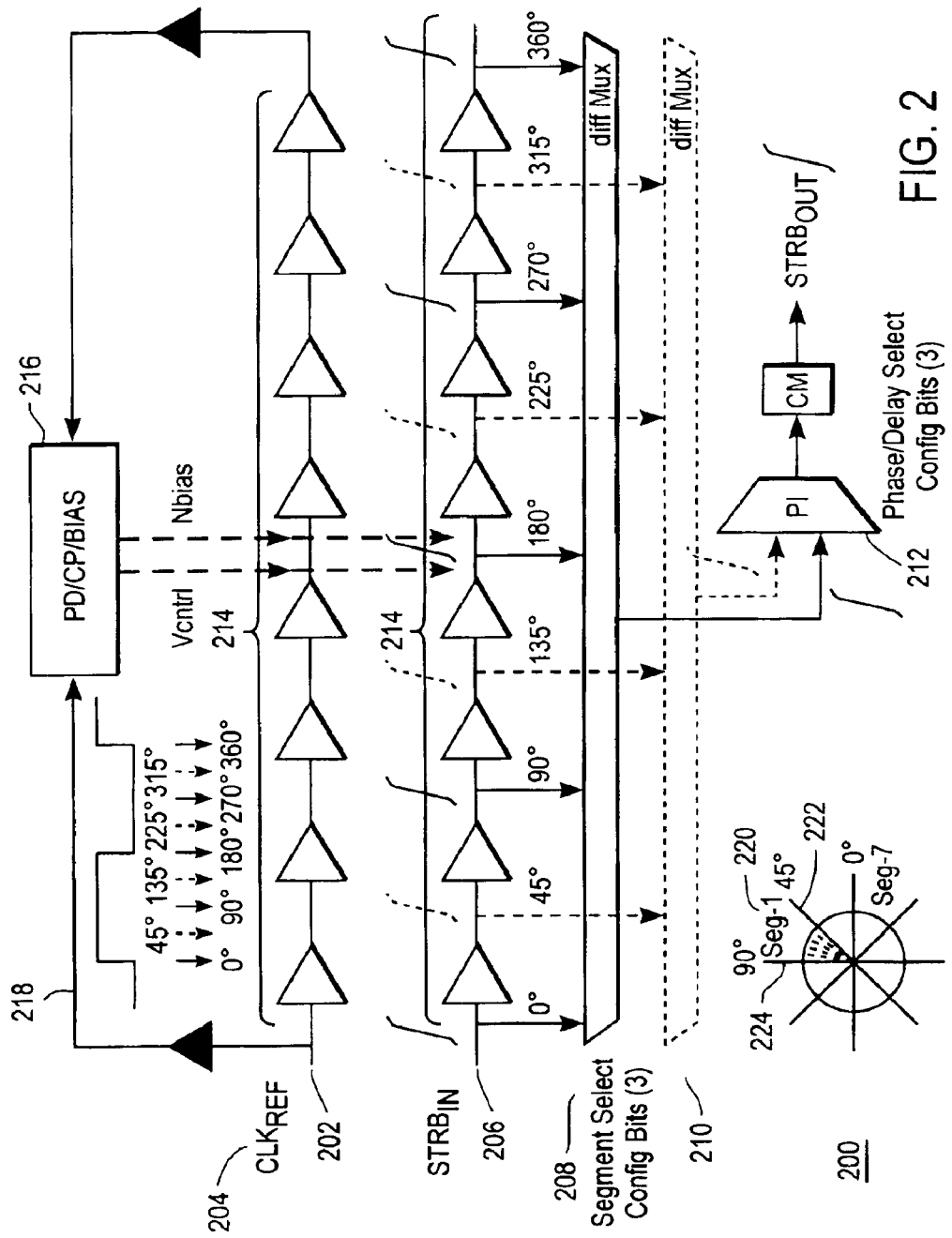
FIG. 2 is a diagram of an embodiment of a DLL Architecture according to the invention.

FIG. 2 is a diagram illustrating an embodiment 200 of a DLL architecture according to the invention. The architecture includes a master or reference feedback loop 202, which locks to a reference clock ($CLK_{REF}$) 204 that may come from a memory controller, and a slave delay line (coupled with master bias) 206, phase selection multiplexers 208 and 210 and phase interpolator 212. A master-slave arrangement is used since the strobe signal is an asynchronous signal.

Master Loop

Master loop 202 includes delay cells or elements 214, phase detectors, charge pump, and bias generators (collectively shown as 216). For the eight delay elements used in the master loop 202, each delay cell 214 covers $T_{REF}/(N=8)$ delay or, 45 degrees of the reference clock. In this embodiment 200, the master loop 202 maintains the cell delay over PVT, and generates a set of analog bias voltages corresponding to the operating point.

Master loop 202 locks to a reference clock $CLK_{REF}$ (having a period $T_{REF}$) 204. With N (for example, N=8) delay elements 214, the individual cell delay is $T_{REF}/N$. Feedback loop 218 maintains this cell delay over process, voltage and temperature. Master loop 202 generates a set of bias voltages corresponding to operating point.

Slave Delay Line

The slave delay line 206 uses the same delay cells 214 and bias voltages 216 as the reference loop 202. By doing so, the slave delay elements 214 produce the same delay as $T_{REF}/8$ or 45 degrees of the master reference clock 204. With eight delay elements 214 in the slave line 206, the incoming strobe produces eight equally spaced (45 degree) delayed edges, as it flows through the delay line 206. Any two consecutive edges can be selected through the even and odd phase selection multiplexers 208 and 210. The selected edges are input to a phase interpolator (PI) 212, which generates eight unit delays between the two selected edges. For the example shown, the step resolution would be approximately 45 degrees/7=6.4 degrees per step.

Embodiments of the architecture can be viewed as coarse-fine delay generation architecture. The master loop 202 generates and maintains the coarse delay for each delay cell (45 degrees/cell). As the asynchronous Strobe edge flows through slave delay line, it generates a set of coarsely delayed edges, which are separated by 45 degrees (set by the master). The slave PI interpolates between the coarse delay edges to produce a finer phase step of 6.4 degrees. This architecture implements a coarse and fine delay generation scheme using only one feedback loop, as compared to a dual-loop implementation used with continuously running clocks.

The resolution improvement comes from the use of the phase interpolator, which generates delays that are much lower than the individual cell delay in the previous generation. The power improvement comes from lower cell current consumption since the cells are operating at coarse delays instead of fine delays. The area reduction is achieved because a few numbers of cells are required to cover the specified delay range.

Referring to FIG. 2, asynchronous strobe signal STRB (DQS) goes through the slave delay line 206. Master delay elements 214 are replicated in the slave delay line 206, along with bias voltages 216. As the strobe STRB passes through slave delay elements 214, slave delay line 206 generates a set of (M) equally spaced delayed edges. The individual cell delay is controlled by master loop 302. Subsequent edges (also called segments) are selected through multiplexers (odd and even multiplexers) 208 and 210, and applied to phase/delay interpolator (PI) 212.

For the selected segment, phase delay/interpolator can generate a set of precise delayed edges, which are selectable through configuration bits. Slave delay line 206 includes taps, including the ones at both ends, providing signals that have equally spaced phases. For example, nine taps provides 9 signals that are equally spaced and separated by 45 degrees.

Slave delay line 206 generates M equally spaced delayed strobe edges. Each of the delay elements 214 has an adjustable delay to provide M equally spaced strobe edges. Various equally spaced phases are tapped off slave delay line 206. For example, delay line has nine taps, including the ones at both ends, providing nine signals that have equally spaced phases. That is, each of the signals is separated by 45 degrees of phase.

Two adjacent strobe edges generated are selected and are applied to phase interpolator 212 to generate finer delays within that segment. Odd and even multiplexers 208 and 210 are used to connect every other delay element 214. For example, odd numbered delay elements are connected to multiplexer 208 and even numbered delay elements are connected to multiplexer 210. Control signal is applied to each multiplexer 208 and 210 to select adjacent edges that are then applied to phase/delay interpolator 212.

For example, adjacent edges 222 and 224 in segment 1 (Seg-1) 220, corresponding to 45 and 90 degrees, may be selected and applied to phase/delay interpolator 212 for further processing. For the selected segment, phase delay/interpolator 212 can generate a set of precise delayed edges, which are selectable through configuration bits.

DRAM and Memory Controller

Figure 3A:
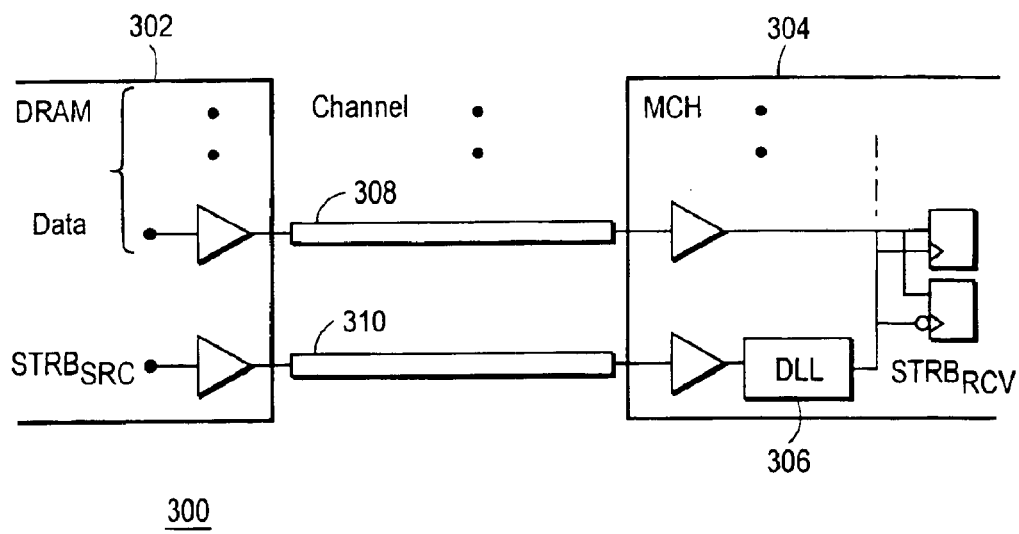
FIG. 3(a) is a diagram of an embodiment of a DDR DRAM and memory controller.

FIG. 3(a) is a diagram of an embodiment 300 of memory 302, such as DDR DRAM, and memory controller 304. Memory edge aligned data 308 is transferred with a strobe signal 310. In particular, the DQS signal is a strobe 310 transmitted by DDR DRAM during a read cycle and by the memory controller, e.g., the memory controller 304 during a write cycle. The DQS signal is edge-aligned with the DQ signal 308 for read cycles. Memory transfers data (DQ) 308 at both rising and falling edges of a bi-directional data strobe (DQS) signal 310. Embodiments of the present invention are directed to the read cycle where the timing to clock the read data by the DQS signal is critical.

Memory controller 304 includes a DLL circuit 306 that places the strobe signal or clock at the middle of the data eye, thereby maximizing system timing margin. As discussed in detail below, DLL circuit 306 is implemented with a delay line and various equally spaced phases are tapped off of the delay line.

DLL—Strobe Placement

Figure 3B:
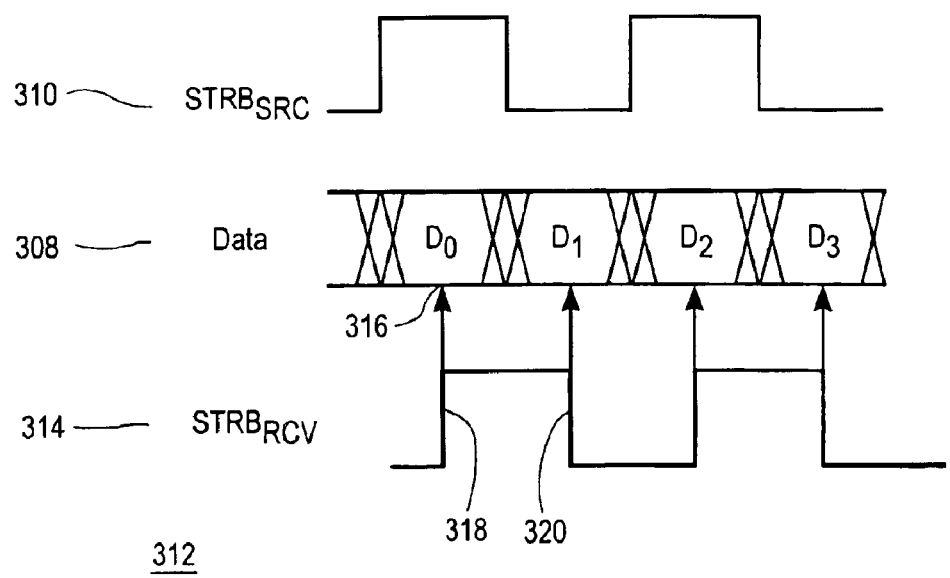
FIG. 3(b) illustrates a timing diagram of signals found in an exemplary implementation of the memory subsystem.

FIG. 3(b) is diagram of an embodiment 312 of timing signals for DLL circuit 306 shown in FIG. 2(a). DLL circuit 306 is used in memory controller 304 to generate an internal strobe delay allowing the incoming strobe 310 to be placed in the middle of data eye (for example, 316) to maximizing system timing. The protocol for the DQS signal 314 and DQ signal 318 allow a bit value to be asserted simultaneous with each rising or falling edge (for example, 318 and 320) of DQS signal 314. Thus, the data values D0, D1, D2, and so forth are available starting at alternate rising and falling edges of DQS signal 314. It should be noted that the invention may also be used with a protocol in which only the rising or falling edge, and not both, of the DQS signal 314 are used to mark the associated bit values.

The DQS signal 310 and DQ signal 308 are received at memory controller 304 following a DQS/DQ flight time interval. The received DQS signal 314 is further delayed at the controller 306, such that its rising or falling edge is positioned closer to the middle of its associated data pulse 308, for more reliable data capture. DLL circuit 306 provides this delay as discussed in detail below. DLL circuit 306 provides a range of delays with very fine step sizes. During boot-up, controller walks through the delay range (for example, 1/4Tbit to 3/4Tbit) and selects the best delay setting within the passing window.

Figure 4A:
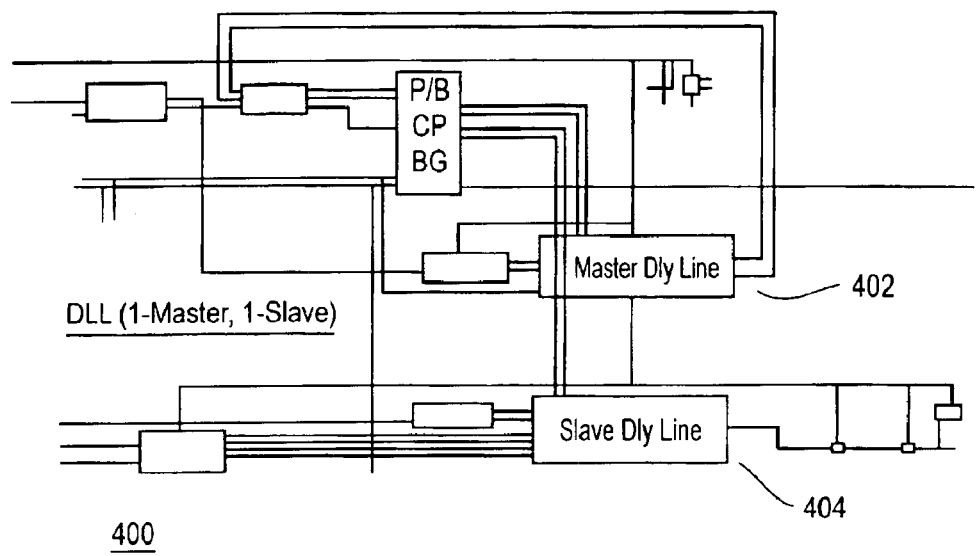
FIG. 4(a) is a top-level diagram of an embodiment of DLL including one master shared with one slave delay line as described above.
Figure 4B:
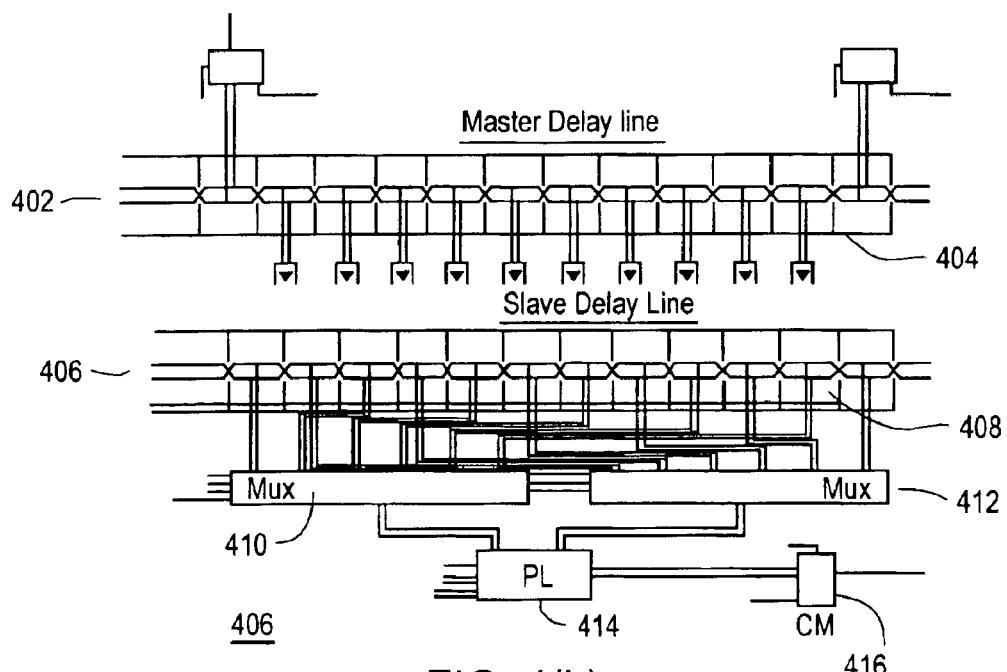
FIG. 4(b) is a detailed diagram of the embodiment shown in FIG. 3(a).

FIG. 4(a) is a diagram of an embodiment 400 of DLL including one master 402 shared with one slave delay line 404 as described above. FIG. 4(b) is a detailed diagram of the embodiment 408 shown in FIG. 2(a) including master loop 402, master delay elements 404, slave delay line 406, slave delay elements 408, multiplexers 410, 412, phase interpolator 414 and converter 416. Embodiments of the present invention can be implemented in ACIO loop-back, silicon debug, slew rate control, system margining and so forth.

In a typical implementation, for DDR-533, _Tbit to _Tbit delay range (Tbit/2 range) with a resolution of <25 pS is used. For master reference clock, a 4X-Clock is used (for example, for DDR-533, 1066 MHz) which provides TREF=Tbit/2. The master reference clock frequency scales with DDR MTs, as are individual cell delay, step size and range.

In accordance with an embodiment of the invention, a programmable master loop element is provided. The number of elements to be used is selectable. This allows the range and resolution of the DLL to be changed. Referring to FIG. 2, eight delay elements are used to cover a delay range of Tref (360 degrees). In accordance with embodiments of the invention, more delay elements can be used to cover more range.

Figure 5:
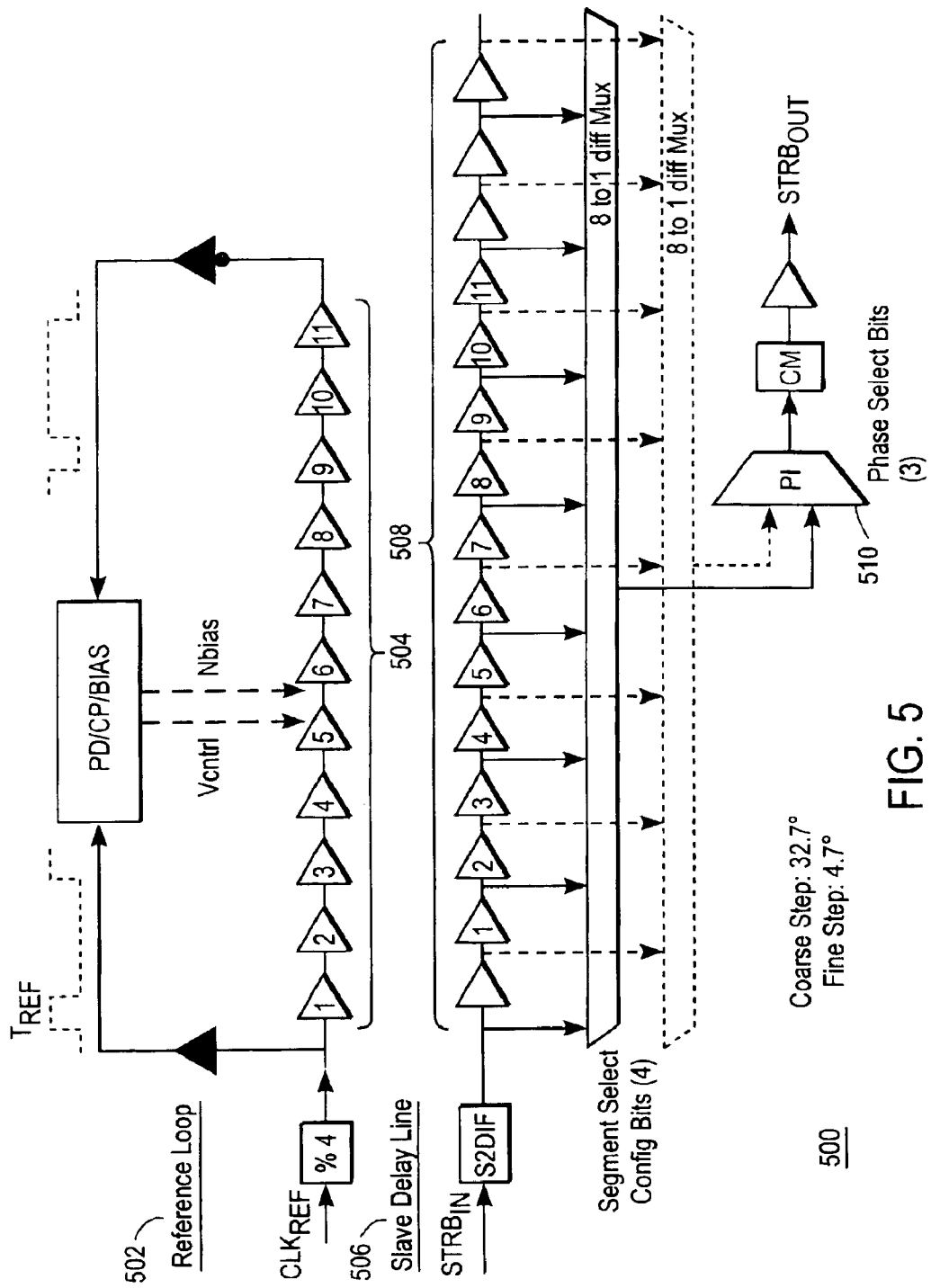
FIG. 5 is a diagram of an embodiment of a DLL implementation.

For example, FIG. 5 is a diagram of an embodiment 500 of a DLL implementation. Eleven delay elements 504 in the master loop 502 are used to generate edges, which are phased delayed by 32.7 degrees. The tighter phase spacing results in lower noise sensitivity. A delay line 506 including 15-delay elements 508 may be used in the slave to meet Tmin (=1/4UI) and Tmax (=3/4UI) over process, voltage and temperature corners. A three-bit thermometer coded phase interpolator 510 generates 4.7 degree fine phase steps to guarantee a monotonic delay. To reduce delay line induced jitter, a differential implementation may be chosen over single ended.

One skilled in the art will recognize that the present invention is not limited to the number of master or slave delay lines. For example, in another embodiment, DLL can include one master shared with two slave delay lines to support strobes of two different DDR channels.

Figure 6:
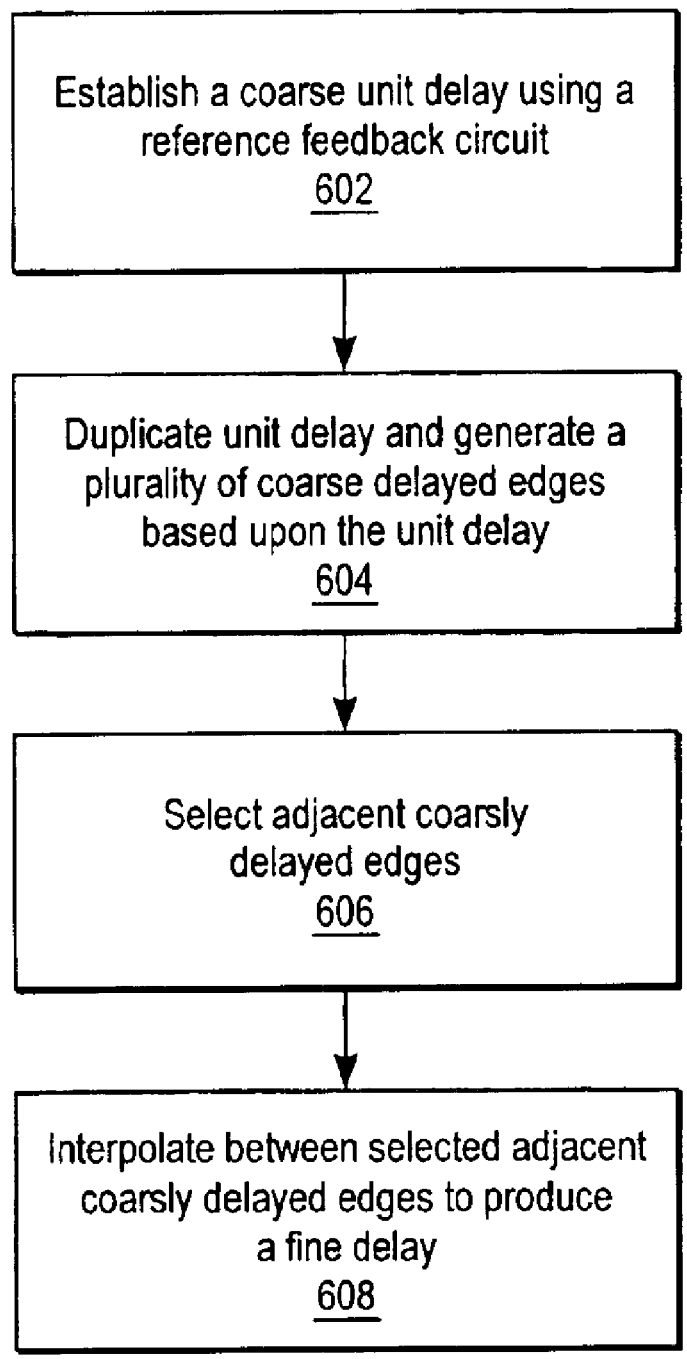
FIG. 6 is a flowchart of an embodiment for implanting the invention.

FIG. 6 is a flowchart of an embodiment 600 for implanting the invention.

In step 602, a coarse unit delay using a reference feedback circuit is established.

In step 604, the unit delay is duplicated and a plurality of coarsely delayed edges generated, based upon the unit delay in a delay circuit. The same delay cells and and bias voltages are used in the delay circuit as the reference feedback circuit. Equally spaced delayed edges are generated in the delay circuit.

In step 606, adjacent edges are selected.

In step 608, the coarse delay edges are interpolated to produce a fine delay.

Figure 7:
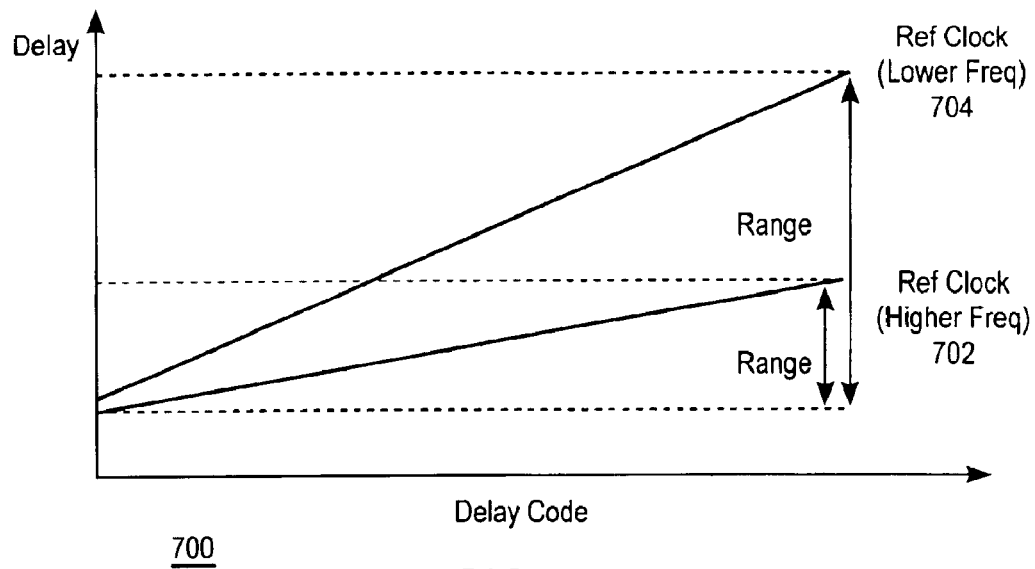
FIG. 7 is a graph of an embodiment of a generalized delay curve.

FIG. 7 is a graph of an embodiment 700 of a generalized delay curve. A delay versus code setting for DDR for lower and higher frequencies is shown. Embodiments of the invention provide a delay code that is selectable or software programmable and allows system margining capability. During boot-up, the system will go through a calibration process, walk through all the code settings, and find the best setting for that particular system. Through system margining, the optimum operating point during bootup is determined.

In particular, the DLL provides a range of delay with certain step resolution. A higher reference clock frequency 702 provides a "smaller range" with "higher step resolution." A lower reference clock frequency 704 provides "higher range" with "lower step resolution." This is consistent with a typical usage condition of DLL. For higher frequencies, a higher resolution is desired. Correspondingly, a smaller range is needed. For lower frequencies, a longer delay range is covered. In most cases, a lower resolution is fine since at lower frequencies, there is more margin. Embodiments of the invention provide the capability of system margining. During boot up, the system can walk through the codes and find an optimum operating delay to be used.

Figure 8:
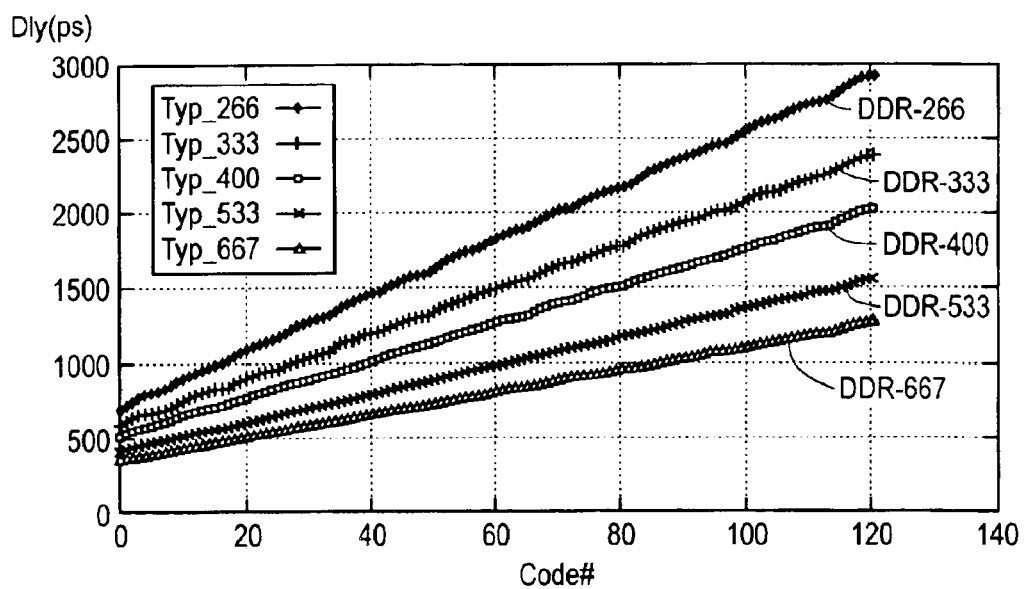
FIG. 8 is a graph of an embodiment of a delay curve over various frequencies.

FIG. 8 is a graph of an embodiment 800 of a delay curve over various frequencies. In particular, the delay curves (i.e. typical corner delay versus code settings) for DDR 266, 333 and 400, and DDR2 533 and 667 MTs are shown. Tthe delay range and step sizes scale with DDR MTs.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
   a reference clock;
   a reference feedback circuit that locks to the reference clock and establishes a coarse unit delay;
   a delay circuit that duplicates the coarse unit delay and generates a plurality of coarsely delayed edges, based upon the coarse unit delay; and
   a phase interpolator that interpolates between the coarse delay edges to produce a fine delay.

2. The apparatus claimed in claim 1, comprising wherein the reference feedback circuit includes delay cells, each delay cell covering delay of the reference clock.

3. The apparatus claimed in claim 2, wherein the reference feedback circuit maintains the cell delay over power, voltage and temperature.

4. The apparatus claimed in claim 2, wherein the reference feedback circuit generates bias voltages corresponding to an operating point.

5. The apparatus claimed in claim 4, wherein the delay circuit uses the same delay cells and bias voltages as the reference feedback circuit.

6. The apparatus claimed in claim 1, wherein the delay circuit generates equally spaced delayed edges.

7. The apparatus claimed in claim 6, further comprising:
   a plurality of multiplexers that selects consecutive edges.

8. The apparatus claimed in claim 7, wherein the plurality of multiplexers comprises even and odd phase selection multiplexers.

9. The apparatus claimed in claim 7, wherein the selected consecutive edges are applied to the phase interpolator for generating unit delays between the selected consecutive edges.

10. The apparatus claimed in claim 2, wherein the reference feedback circuit generates and maintains a coarse delay for each delay cell.

11. An apparatus
comprising:
   a delay circuit to generate a plurality of delay strobe edge signals with different phases from a data strobe signal;
   a phase interpolator that generates, from the plurality of delay strobe edge signals, a new delay strobe edge signal having an intermediate phase, wherein the delay circuit to generate a plurality of delay strobe edge signals with different phases from a data strobe signal further comprises:
      a single master loop circuit that includes n master delay elements, locks to a reference clock, and generates a set of bias voltages corresponding to an operating point;
      a slave delay circuit that includes
      n slave delay elements replicated from the master delay elements such that the individual delay is controlled by master loop wherein data strobe passes through the slave delay elements and equally spaced delayed edges are generated;
      multiplexers for selecting adjacent delayed edges from the slave delay elements; and
      a phase interpolator to receive the selected adjacent delayed edges and interpolating between the selected adjacent delayed edges to produce a plurality of precision delayed edges.

12. The apparatus claimed in claim 1, wherein the precision delayed edges are selectable through configuration bits.

13. The apparatus claimed in claim 11, wherein the master loop circuit further comprises a feedback loop to maintain cell delay over process, voltage and temperature.

14. The apparatus of claimed in claim 11, wherein the data strobe signal is provided in a read mode of a memory device.

15. The apparatus of claimed in claim 14, wherein the memory device is a double data rate (DDR) random access memory (RAM).

16. A method, comprising:
   establishing a coarse unit delay using a reference feedback circuit;
   duplicating the coarse unit delay and generating a plurality of coarsely delayed edges, based upon the coarse unit delay in a delay circuit;
   selecting adjacent coarsely delayed edges; and
   interpolating between the selected adjacent coarsely delayed edges to produce a fine delay.

17. The method claimed in claim 16, further comprising:
   generating bias voltages corresponding to an operating point.

18. The method claimed in claim 16, wherein duplicating the unit delay and generating a plurality of coarsely delayed edges, based upon the unit delay in a delay circuit further comprises:
   using the same delay cells and bias voltages in the delay circuit as the reference feedback circuit.

19. The method claimed in claim 16, further comprising:
   generating equally spaced delayed edges in the delay circuit.

20. The method claimed in claim 16, further comprising:
   selecting a delay code that allows for system margining capability.

21. The method claimed in claim 20, wherein selecting a delay code that allows for system margining capability further comprises:

proceeding through a calibration process, walking through code settings, and determining a best setting during boot up.

22. A machine readable medium having stored therein a plurality of machine readable instructions executable by a processor to generate a delay, comprising:

instructions to establish a coarse unit delay using a reference feedback circuit;

instructions to duplicate the coarse unit delay and generating a plurality of coarsely delayed edges, based upon the coarse unit delay in a delay circuit; and instructions to select adjacent coarsely delayed edges; and instructions to interpolate between the selected adjacent coarsely delayed edges to produce a fine delay.

23. The machine readable medium claimed in claim 22, further comprising:

instructions to generate bias voltages corresponding to an operating point.

24. The machine readable medium claimed in claim 22, wherein instructions to duplicate the unit delay and generating a plurality of coarsely delayed edges, based upon the unit delay in a delay circuit further comprises:

instructions to use the same delay cells and bias voltages in the delay circuit as the reference feedback circuit.

25. The machine readable medium claimed in claim 22, further comprising:

instructions to generate equally spaced delayed edges in the delay circuit.

26. The machine readable medium claimed in claim 22, further comprising:

instructions to select a delay code that allows for system margining capability.

27. The machine readable medium claimed in claim 26, wherein instructions to select a delay code that allows for system margining capability further comprises:

instructions to proceed through a calibration process, walk through code settings, and determine a best selling during boot up.

* * * * *